United States Patent
Albert et al.

(10) Patent No.: US 7,304,719 B2
(45) Date of Patent: Dec. 4, 2007

(54) PATTERNED GRID ELEMENT POLARIZER

(75) Inventors: Michael M. Albert, Seymour, CT (US); Harry Sewell, Ridgefield, CT (US)

(73) Assignee: ASML Holding N.V. (NL)

( * ) Notice: Subject to any disclaimer, the term of this patent is extended or adjusted under 35 U.S.C. 154(b) by 0 days.

(21) Appl. No.: 10/813,168

(22) Filed: Mar. 31, 2004

(65) Prior Publication Data

US 2005/0219696 A1    Oct. 6, 2005

(51) Int. Cl.
*G03F 7/20* (2006.01)
*G02B 5/30* (2006.01)

(52) U.S. Cl. ............ 355/71; 359/352; 359/486

(58) Field of Classification Search .......... 359/486, 359/489, 352; 355/71
See application file for complete search history.

(56) References Cited

U.S. PATENT DOCUMENTS

| | | | | |
|---|---|---|---|---|
| 3,719,415 | A * | 3/1973 | Rawson | 359/485 |
| 3,877,789 | A * | 4/1975 | Marie | 359/500 |
| 4,049,944 | A | 9/1977 | Garvin et al. | |
| 4,514,479 | A | 4/1985 | Ferrante | |
| 5,365,371 | A | 11/1994 | Kamon | |
| 5,748,368 | A | 5/1998 | Tamada et al. | |
| 5,922,513 | A * | 7/1999 | Jeon et al. | 430/311 |
| 6,122,103 | A | 9/2000 | Perkins et al. | |
| 6,191,880 | B1 | 2/2001 | Schuster | |
| 6,268,915 | B1 * | 7/2001 | Abraham et al. | 356/367 |
| 6,375,870 | B1 | 4/2002 | Visovsky et al. | |
| 6,943,941 | B2 * | 9/2005 | Flagello et al. | 359/352 |
| 2002/0154672 | A1 * | 10/2002 | Friesem et al. | 372/92 |
| 2002/0167727 | A1 * | 11/2002 | Hansen et al. | 359/486 |
| 2002/0176166 | A1 * | 11/2002 | Schuster | 359/494 |
| 2002/0186462 | A1 | 12/2002 | Gerhard | |
| 2002/0191185 | A1 * | 12/2002 | Rotter et al. | 356/369 |
| 2002/0191880 | A1 | 12/2002 | Borrelli et al. | |
| 2003/0142400 | A1 | 7/2003 | Hansen et al. | |
| 2003/0206337 | A1 | 11/2003 | Liang et al. | |
| 2003/0223670 | A1 | 12/2003 | Nikolov et al. | |
| 2003/0227678 | A1 | 12/2003 | Lines et al. | |
| 2004/0008310 | A1 * | 1/2004 | Leidig et al. | 349/124 |
| 2004/0047038 | A1 | 3/2004 | Jiang et al. | |

(Continued)

FOREIGN PATENT DOCUMENTS

DE    19621512 A1 * 12/1997

(Continued)

OTHER PUBLICATIONS

Bird, G.R., and Parrish Jr., M., "The Wire Grid as a Near-Infrared Polarizer," *J. Opt. Soc. Am. 50*:886-891, American Institute of Physics (1960).

(Continued)

*Primary Examiner*—Alessandro Amari
*Assistant Examiner*—Mark Consilvio
(74) *Attorney, Agent, or Firm*—Sterne, Kessler, Goldstein & Fox P.L.L.C.

(57) ABSTRACT

The invention relates to a patterned grid polarizer for use in lithography, comprising a substrate that is transparent to ultraviolet (UV) light; and an array of elements patterned on the substrate, wherein the elements polarize UV light. The array of elements can be patterned to produce tangentially or radially polarized UV light.

23 Claims, 3 Drawing Sheets

U.S. PATENT DOCUMENTS

| | | | |
|---|---|---|---|
| 2004/0165269 A1* | 8/2004 | Hasman et al. | 359/573 |
| 2004/0169924 A1* | 9/2004 | Flagello et al. | 359/486 |
| 2004/0180294 A1* | 9/2004 | Baba-Ali et al. | 430/311 |
| 2004/0227923 A1 | 11/2004 | Flagello et al. | |
| 2005/0128458 A1* | 6/2005 | Blatchford | 355/71 |
| 2005/0146789 A1* | 7/2005 | Wegmann et al. | 359/486 |

FOREIGN PATENT DOCUMENTS

| | | |
|---|---|---|
| EP | 05 00 6957 | 7/2005 |
| JP | 05307112 A * | 11/1993 |
| SU | 2166819 C2 | 5/2001 |

OTHER PUBLICATIONS

Hecht, E., "The Wire-Grid Polarizer," in *Optics, 4th Edition, Section 8.3.1,* Black, A., ed., Addison-Wesley, Reading, MA, pp. 333-334 (2002).

Schellenberg, F., "A Little Light Magic," *IEEE Spectrum 40:*34-39, Institute of Electrical and Electronics Engineers (Sep. 2003).

English Translation Abstract of Russian Patent No. RU 2166819 C2.

The Singapore Search Report, mailed Oct. 18, 2005.

Scime, E. et al., "Extreme-Ultraviolet Polarization and Filtering with Gold Transmission Gratings", Applied Optics, Feb. 1, 2005, pp. 648-654, vol. 34, No. 4, Washington, D.C.

* cited by examiner

PATTERNED GRID ELEMENT POLARIZER

BACKGROUND OF THE INVENTION

1. Field of the Invention

The present invention relates to polarizing optical elements.

2. Background Art

Polarizers

The simplest grid element polarizers are devices that consist of a grid of parallel conducting wires. When light impinges on the grid, each orthogonal component of the radiation interacts differently with the wire grid polarizer. The component of the field which is parallel to the wires drives conduction electrons along the length of each wire, thus generating a current. The electrons in turn collide with lattice atoms, imparting energy to them and thereby heating the wires. In this manner energy is transferred from the field to the grid. In addition, electrons accelerating parallel to the wires radiate in both the forward and backward directions. The incident wave tends to be canceled by the wave reradiated in the forward direction, resulting in little or no transmission of that component of the field. The radiation propagating in the backward direction simply appears as a reflected wave. In contrast, the component of the wave that is perpendicular to the wires is essentially unaltered as it propagates through the grid. (Eugene Hecht, *Optics*, Chapter 8, pp. 333-334, Addison Wesley, San Francisco (2002)).

In 1960 George R. Bird and Maxfield Parish, Jr. described a grid polarizer for use in the microwave range having 2160 wires per mm (G. R. Bird and M. Parrish, Jr., *J Opt. Soc. Am.* 50:886 (1960)). Accordingly to the article, this was accomplished by evaporating a stream of gold (or aluminum) atoms at nearly grazing incidence onto a plastic diffraction grating replica. The metal accumulated along the edges of each step in the grating to form thin microscopic "wires" whose width and spacing were less than one wavelength across.

Grid polarizers have been developed for use both in the IR and visible spectrum. For example, U.S. Pat. No. 6,122,103 describes setting forth a wire grid polarizer for the visible spectrum which has a plurality of elongated elements supported on a substrate. U.S. Pat. No. 5,748,368 also describes a wire grid polarizer that polarizes light in the visible light spectrum.

Lithography

In order to create faster and more sophisticated circuitry, the semiconductor industry continually strives to reduce the size of the circuit elements. The circuits are produced primarily by photolithography. In this process, the circuits are printed onto a semiconductor substrate by exposing a coating of radiation sensitive material to light. The radiation sensitive material is often referred to as a "photoresist" or just resist. Passing the light through a mask, which may consist of a pattern of chrome or other opaque material formed on a transparent substrate, generates the desired circuit pattern. The mask may also be formed by a pattern of higher and lower regions etched into the surface of a transparent substrate, or some combination of the two techniques. Subsequent thermal or chemical processing removes only the exposed or only the unexposed regions of the resist (depending on the material) leaving regions of the substrate bare for further processing which in turn produces the electronic circuit.

Polarization at the reticle affects the lithographic performance of the lens several ways. First, the interaction of the illumination with features of the reticle, say for example dense lines of chrome, varies with polarization. The result is that the transmission and scattering of the mask depend on the polarization of the light and the features of the mask. Second, reflections at the surfaces of the lenses and mirrors are polarization dependent so that the apodization and to a lesser degree the wavefront at the projection optics ("P.O.") depend on polarization. Also, the reflection from the surface of the resist depends on polarization, and this too is effectively a polarization dependent apodization. Finally, the rays diffracted from the reticle that are brought back together at the wafer must interfere to produce an image. However, only parallel components of the electric field can interfere, so the polarization state of each ray at the wafer affects the coherent imaging. Even with a perfect lens, the three dimensional geometry of the rays arriving at the wafer can reduce the contrast.

The primary reason for considering a polarized illuminator is to improve the image formed at the wafer by improving the interference of the diffracted rays at the wafer. This is particularly useful in high numerical aperture systems. Consider dipole illumination incident on a binary mask of dense lines. Each small region in the illuminator pupil (i.e., each pole of a low sigma dipole) is incoherent with other regions in the pupil and makes its own image at the wafer, so one can consider a single pole of the dipole illumination. The light diffracts from the reticle, and the dense lines produce tight diffraction orders. For small features, only two diffraction orders are accepted into the P.O. At the wafer, these diffraction orders recombine to form an image of the mask. The image of the mask depends on the contrast, and the contrast is dependent on the polarization.

BRIEF SUMMARY OF THE INVENTION

As described, the polarization state of the illumination at the reticle in lithography can improve the image formed at the wafer. Because lithography, in addition to other applications, uses light in the ultraviolet spectrum, there exists a need for polarizers for such UV applications. The inventors recognized that wire grid polarizers have particular advantages because of the ability to custom pattern the elements depending on the application. Such polarizers are needed, for example, to produce a pattern of polarization in the pupil of the illuminator of an optical system or the projection optics of a lithographic system.

The present invention provides patterned grid polarizers that provide high transmission efficiency over the ultraviolet spectrum. The grid polarizers of the present invention are generally comprised of a substrate with patterned elements. The polarization of light exiting the polarizers of the present invention depend on the pattern of elements on the substrate.

In one embodiment, elements are arranged in groups in a circular arrangement about an optical axis to produce tangentially polarized outgoing light. In another embodiment, elements are patterned as concentric circles about an optical axis to produce radially polarized outgoing light.

The present invention further provides optical systems, including lithography systems, that comprise the polarizers of the present invention. Such systems, such as lithographic systems, benefit from having a patterns of polarization that enhance imaging at the wafer.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

DETAILED DESCRIPTION OF THE INVENTION

Reference will now be made to the drawings in which the various elements of the present invention will be given numerical designations and in which the invention will be discussed so as to enable one skilled in the art to make and use the invention.

In one embodiment, a patterned grid polarizer is provided for use in lithography. Such polarizers comprise a substrate that is transparent to ultraviolet (UV) light; and an array of elements patterned on the substrate, wherein the elements polarize UV light.

Grid Element Patterns

The present invention provides UV polarizers with elements on the substrate patterned in a variety of ways. In certain aspects of the present invention, the pattern of elements on the substrate dictates the polarization of the light exiting the polarizer.

In certain applications, having a pattern of polarization in the pupil of the illuminator of an optical system or the projection optics of a lithographic system is advantageous for imaging for a variety of reasons. For example, such polarization patterns can provide greater contrast at the wafer for better imaging.

Accordingly, in an aspect of the present invention, the polarizers of the present invention comprise elements that are patterned on the substrate to produce polarized light, wherein the pattern of polarization of the light is dictated by the pattern of the elements.

For example, the elements can be patterned on the substrate to produce tangentially polarized (i.e., tangential to the cylindrical symmetry of the polarizer) outgoing light from unpolarized incoming light, wherein the incoming light is incident upon the polarizer and outgoing light exits the polarizer.

Alternatively, the elements can be patterned on the substrate to produce radially polarized (i.e., radially with respect to the cylindrical symmetry of the polarizer) outgoing light from unpolarized incoming light, wherein the incoming light is incident upon the polarizer and outgoing light exits the polarizer.

The invention is not limited to polarizers producing tangentially or radially polarized light, however. The invention further encompasses polarizers with varying element patterns that depend on the particular lithographic application. Such patterns can be obtained by using software applications or other design techniques to produce a custom pattern. Accordingly, the present invention provides UV polarizers with element patterns specific to certain lithographic applications.

Figure 1:
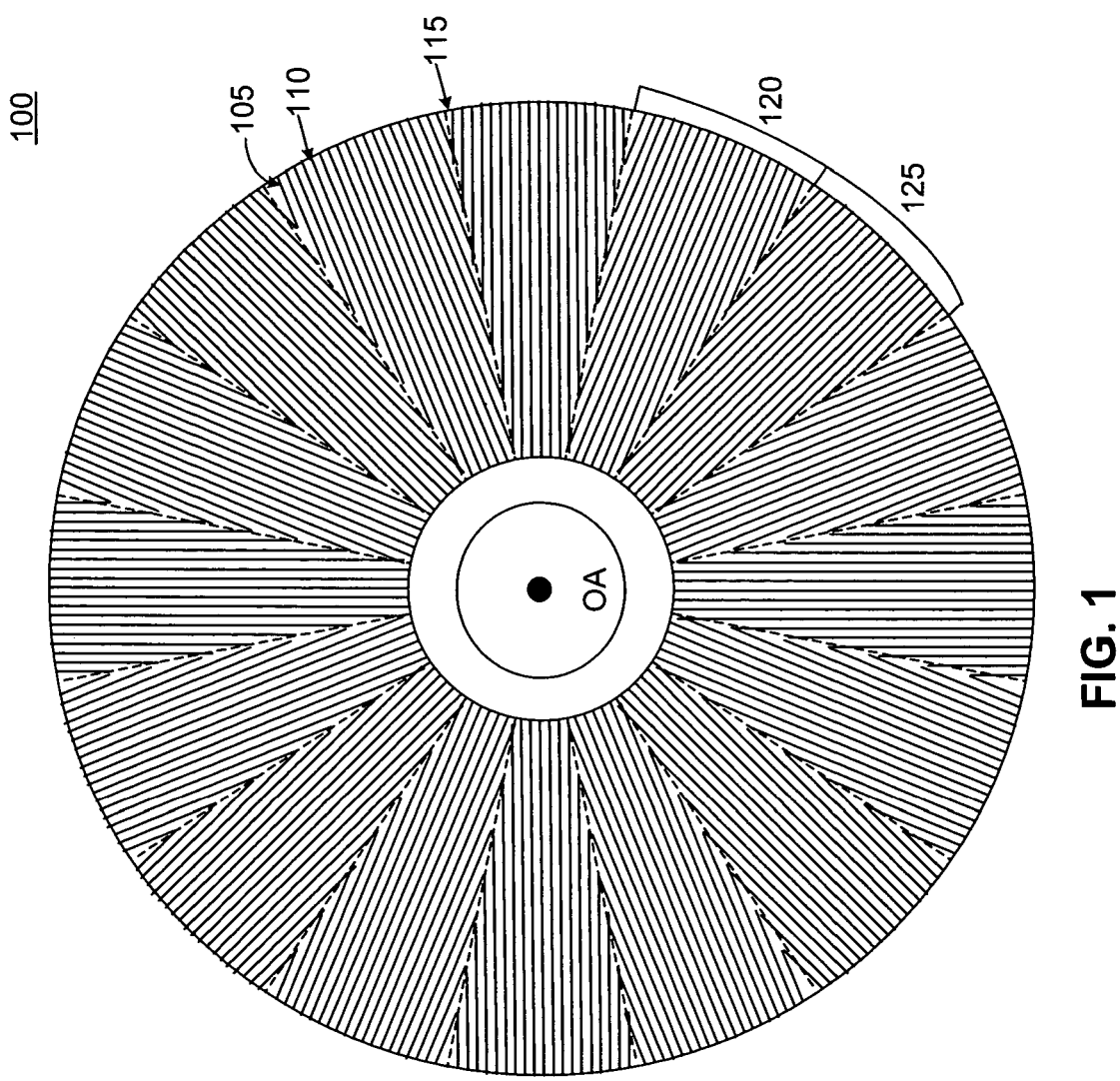
FIG. 1 is a schematic representation of an embodiment of a polarizer of the present invention.

FIG. 1 sets forth an embodiment of a wire grid polarizer of the present invention, indicated generally at 100. In this embodiment, the pattern of elements 105 on the wire grid polarizer is configured to produce tangentially polarized light. As shown, elements 105 are linear and are patterned in a plurality of groups (for example, two groups are designated 120 and 125), wherein each group is comprised of parallel elements and the groups are arranged in a circular pattern about an optical axis ("OA"). Dotted line 115 illustrates the dividing line between the elements. In this embodiment, the elements of one group are not parallel to the elements of a second, adjacent, group. For example, group 120 is adjacent to group 125 and, while the elements within group 120 are parallel to each other, they are not parallel to the elements of group 125.

In the polarizer shown in FIG. 1, a plurality of elongated conductive elements 105 are supported by a transparent substrate 110. The dimensions of the elements, and the dimensions of the arrangement of elements, are determined by the wavelength used, and are tailored for broad or full spectrum UV light. In any particular group, the elements are not all of the same length, and are shorter toward the edges of the group. In this way, each group 120, 125 has an appropriate "wedge" shape so that the groups can be radially arranged in a circular pattern around the optical axis OA.

Figure 2:
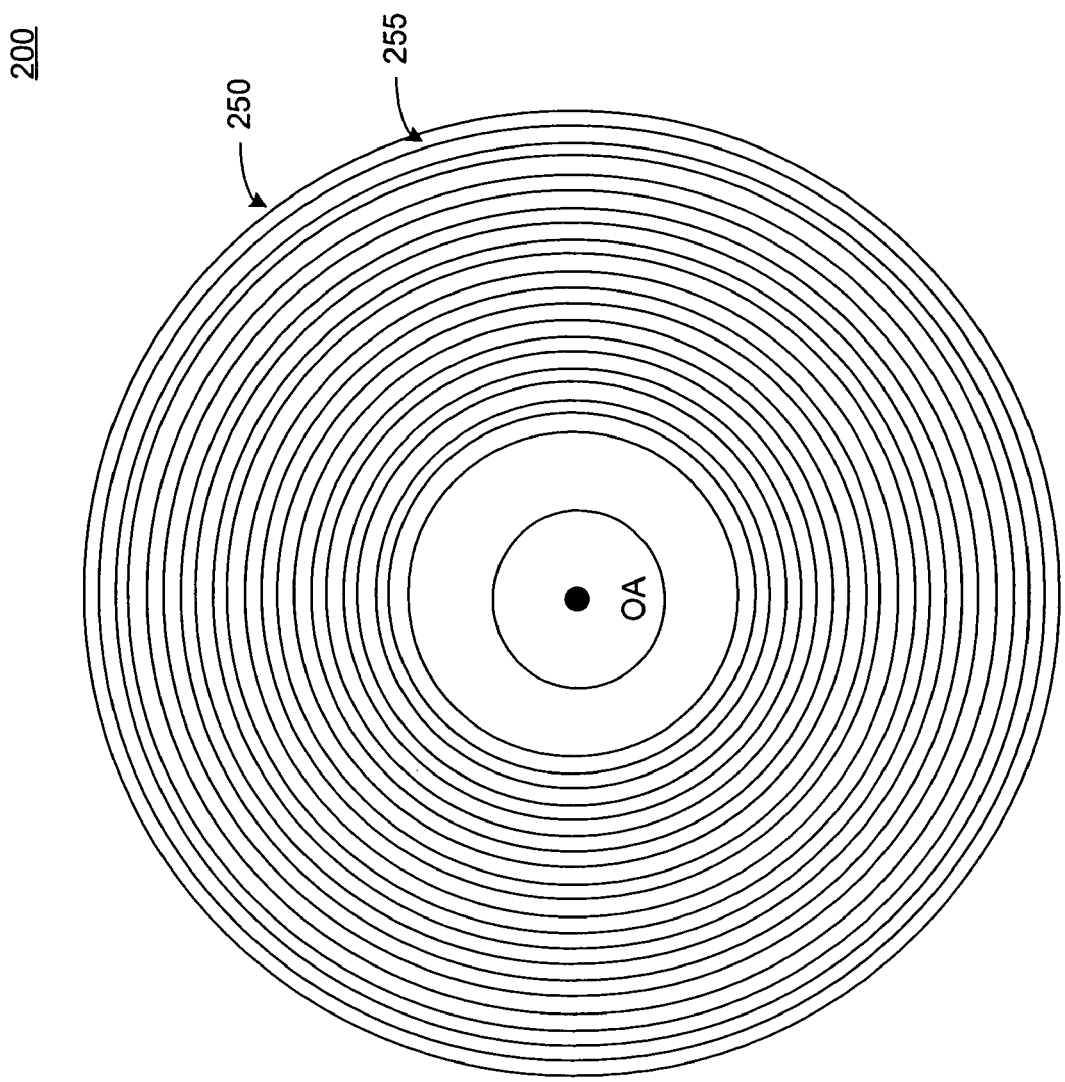
FIG. 2 is a schematic representation of an embodiment of a polarizer of the present invention.

FIG. 2 sets forth an embodiment of a wire grid polarizer of the present invention, indicated generally at 200. In this embodiment, the pattern of elements 250 on the wire grid polarizer is configured to produce radially polarized light. As shown, the plurality of elements 250 are patterned in concentric circles on a substrate 255. Again, the dimensions of the elements, the dimensions between elements, and the dimensions of the arrangement of elements are determined by the wavelength used and are optimized for broad or full-spectrum UV light.

Grid Elements and Substrate

In an embodiment of the present invention, the elements are patterned on substrates and are formed from a conducting material, for example, a metal. The elements can be made from, for example, aluminum, silver or gold. Such elements can include, but are not limited to, wires or microwires.

In a further embodiment of the present invention, the substrate of the polarizers of the present invention is all or partially transparent to UV light and may be selected from any of the following, including, but not limited to, fused silica, calcium fluoride, sapphire, quartz and magnesium fluoride. The present invention is not so limited and other thicknesses and materials can be used as would be apparent to a person skilled in the art given this description.

The spacing between elements is dictated by the wavelength used. The spacing between elements is also referred to as the pitch and, for concentric circle patterned elements, the pitch is the distance between corresponding points on two adjacent elements.

In an embodiment of the present invention, the spacing of the elements is smaller than the wavelength of light. Thus, the pitch can be less than approximately 200 nanometers (nm) for parallel elements or concentric circle elements and less than approximately 200 nm at the widest point between two adjacent non-parallel elements. In an embodiment, the elements are spaced at between about one tenth of a wavelength of the UV light and twice the wavelength of the UV light.

While the spacing between elements can be less than the wavelength of light, the invention is not so limited. The spacing between elements, and particularly the boundaries between, for example, zones of parallel elements, can also be greater than the wavelength of light.

In an embodiment, the elements of the polarizers of the present invention have a period of about one quarter of a wavelength of the UV light or a period of between about 45 nm and 95 nm. The present invention is not so limited and other periods and wavelengths can be used as would be apparent to one of ordinary skill in the art given this description.

In embodiments, the pitch is approximately one-half the wavelength of light, or about 100 nm. Grids with longer periods (greater than approximately twice the wavelength of light) operate as diffraction gratings; grids with shorter periods (less than approximately half the wavelength of light) operate as a polarizer; and grids with periods in a transition region in between the longer and shorter periods also act as diffraction gratings and may be characterized by abrupt changes or anomalies referred to as resonances. Furthermore, in an example, the elements of the polarizers of the present invention are regularly or equally spaced. Alternatively, the invention is not so limited and the elements of the polarizers of the present invention can also be irregularly spaced.

In particular aspects of the present invention where the elements are linear, the elements can be relatively long and thin. For example, each element can have a length that is generally larger than the wavelength of UV light. In one example, the elements have a length of between approximately 400 nm to about 60 mm, but can also be longer.

In addition, each element has a width that may range from 10% to 90% of the pitch. The elements also have a thickness which may be greater than about 10 nm, and will be less than about 200 nm. Preferably, the elements have a thickness of between approximately 20 nm and 100 nm.

The element width can be selected to optimize the performance of the polarizer device for specific applications. In general, increasing the width of the elements with respect to the pitch will increase the reflectivity for the parallel polarization to nearly 100% while also increasing the reflectivity for the orthogonal polarization from the ideal value of 0%. Thus, typically a high ratio of element width to spacing will provide high extinction ratio for transmitted light because none of the parallel polarization is transmitted, but not necessarily high efficiency because some of the orthogonal polarization will be reflected. Conversely, in general, a low ratio of element width to pitch will provide high extinction ratio for the reflected beam, but not necessarily high efficiency. The highest total efficiency, as defined by the product of the reflectivity for the parallel beam and the transmissivity for the orthogonal beam may likely be obtained when the ratio of the element width to element pitch is 40% to 60%.

Apparatus

The invention further provides apparatuses that utilize the polarizers of the present invention. For example, the polarizers of the present invention can be used in apparatus for polarizing UV light. Such an apparatus can, for example, comprise a source producing a light beam having at least one wavelength within the UV spectrum; a substrate transparent to light in the UV spectrum and disposed in a path of the light beam; and an array of elements lithographically etched onto the substrate; wherein the array of elements lithographically etched onto the substrate creates polarized outgoing light.

In particular embodiments, the UV light emanating from the source comprises at least two polarizations, wherein the wire grid polarizer reflects most of the light of a first polarization and transmits most of the light of a second polarization.

The invention also provides an apparatus for providing an exposure beam along an optical path comprising a wire grid polarizer; and an illuminator having a pupil; wherein the polarizer comprises a substrate that is transparent to UV light and an array of elements patterned on the substrate, wherein the elements polarize UV light, and further wherein the polarizer produces a pattern of polarization in the pupil of the illuminator.

The invention further provides an apparatus for providing an exposure beam along an optical path comprising a wire grid polarizer; and projection optics; wherein the polarizer comprises a substrate that is transparent to UV light and an array of elements patterned on the substrate, wherein the elements polarize UV light, and further wherein the polarizer produces a pattern of polarization in the projection optics.

The wire grid polarizers of the present invention are particularly useful in the field of lithography, where using polarized light allows greater contrast at the wafer and results in better imaging. In general, polarization effects lithography in four ways, (1) transmission and diffraction of reticle features; (2) Fresnel losses in the projection optics lens; (3) Fresnel reflection at the surface of the resist; and (4) vector interference. Taking all four factors in to consideration, an optimum pattern of polarization for lithography for a particular reticle and illumination condition may vary.

While the optimum pattern of polarization for lithography may vary, tangential polarization often can be a satisfactory choice. Reticles have repeated structures, usually horizontally or vertically across the mask. Structures are also repeated on the reticles at other orientations as well. Repeating structures can act like a one dimensional diffraction grating and diffract the light into a few tight beams in a row. If these beams interfere well when the beams are brought back together at the wafer, a good image will result. Very small features are the most difficult to image, and a repeating structure of the smallest features produces two diffraction orders at the opposite edges of the projection optics pupil. In many cases, tangential polarization may be preferred for imaging such features.

Similarly, radial polarization has advantages in particular situations. For example, using radial polarization can minimize Fresnel losses which leads to greater light intensity. Radial polarization has advantages, therefore, when high intensity is desired. In one embodiment, radial polarization is desirable to image features that already have good contrast. On the other hand, in imaging features with limited contrast, which are usually the smallest features, tangential polarization would be desirable.

Figure 3:
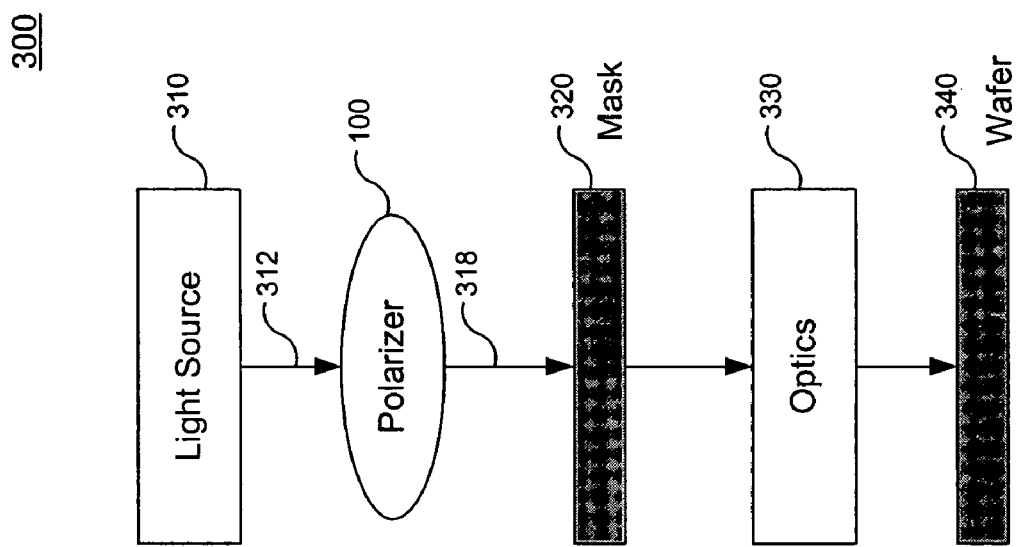
FIG. 3 is a schematic representation of a lithographic system that includes a polarizer according to a further embodiment of the present invention.

The present invention therefore provides an optical lithography system 300 for exposing a layer of radiation sensitive material on a semiconductor wafer that incorporates a polarizer of the present invention. As FIG. 3 demonstrates, preferably such a system 300 includes, but is not limited to, a source of radiant energy 310, a wire grid polarizer of the present invention 100, a mask 320, projection optics 330, such as a lens system, and the wafer which contains a layer 340 of radiation sensitive material. In an embodiment, radiant energy 312 from the light source passes to a polarizer 100 that polarizes the light in a predetermined orientation and outputs polarized radiant energy beam 318 to mask 320.

The polarized radiant energy beam 318 passes through mask 320 and exposes layer 340 in a predetermined pattern.

It should be noted that in lithography often the entire pupil is not used. Thus, only certain regions of the pupil are illuminated in particular lithographic applications. For example, in "dipole" illumination, only two regions at the edge of the pupil are illuminated. Accordingly, in particular embodiments of the lithographic systems of the present invention, the entire beam exiting from the polarizers of the present invention is not used. For example, the pattern of polarization may not be uniform over the whole pupil or imperfect in some other fashion. In such cases, only the portion of the pupil that has the desired polarization can be used.

Additional advantages of embodiments of the present invention are that wire grid polarizers 100, 200 can have a very high angular acceptance, so that the polarization pattern can be introduced at any pupil plane in an optical system. Since the grid elements act as a polarizer, an unpolarized beam can be used upstream to further simplify design. Any polarization pattern can be achieved by simply choosing the pattern of the wire grid elements.

Methods

Depositing the array of conductive elements on the substrate can be done by any of several commonly-known processes. For example, both Garvin, in U.S. Pat. No. 4,049,944, and Ferrante, in U.S. Pat. No. 4,514,479, describe the use of holographic interference lithography to form a fine grating structure in photoresist, followed by ion beam etching to transfer the structure into an underlying metal film. Stenkamp ("Grid polarizer for the visible spectral region", Proceedings of the SPIE, vol. 2213, pages 288-296) describes the use of direct e-beam lithography to create the resist pattern, followed by reactive ion etching to transfer the pattern into a metal film. Other high-resolution lithography techniques, including extreme ultraviolet lithography and X-ray lithography, e.g., X-ray holographic interference lithography, could also be used to create the resist pattern. Other techniques, including other etching mechanisms and lift-off processes, could be used to transfer the pattern from the resist to a metal film. The exact process used to form the array of conductive elements is not critical to the present invention.

It is to be understood that the described embodiments of the invention are illustrative only, and that modifications thereof may occur to those skilled in the art. For example, the invention is equally applicable to all incidence angles with appropriate adjustment of the physical parameters of the polarizer device. Alterations will surely occur to those skilled in the art given the significant increase in design flexibility over the prior art that is achieved by the present invention. Accordingly, this invention is not to be regarded as limited to the embodiments disclosed.

What is claimed is:

1. A lithography apparatus comprising:
   (a) a source producing a light beam having at least one wavelength within an ultraviolet (UV) spectrum;
   (b) a mask;
   (c) a substrate transparent to light in the UV spectrum and disposed in a path of the light beam; and
   (d) an array of wire elements patterned on the substrate;
   wherein the array of wire elements are divided into truncated wedge-shaped groups having parallel wire elements therein to polarize the UV light incident on the wire elements and to produce output light that is tangentially polarized about an axis at a center of the substrate, wherein adjacent truncated wedge-shaped groups are arranged around the axis, leaving an unpatterned transmission aperture at the center of the substrate.

2. The apparatus of claim 1, wherein the wire elements in each of the truncated wedge-shaped groups have a pitch of about one quarter of the wavelength of the beam.

3. The apparatus of claim 1, wherein the wire elements in each of the truncated wedge-shaped groups have a pitch between about $0.1\lambda$ and $2\lambda$, where $\lambda$ is the wavelength of the beam.

4. The apparatus of claim 3, wherein the wire elements in each of the truncated wedge-shaped groups have a pitch between about $0.1\lambda$ and $0.5\lambda$, where $\lambda$ is the wavelength of the beam.

5. The apparatus of claim 3, wherein the wire elements in each of the truncated wedge-shaped groups have a pitch of about one quarter of a wavelength of the UV light.

6. The apparatus of claim 3, wherein the wire elements in each of the truncated wedge-shaped groups have a pitch of between about 45 nm and 95 nm.

7. The apparatus of claim 1, wherein the wire elements have a thickness of between about 0.04 and 0.3 μm.

8. The apparatus of claim 1, wherein a material of the substrate includes fused silica, calcium fluoride, sapphire, quartz, or magnesium fluoride.

9. The apparatus of claim 1, wherein the UV light incident on the wire elements comprises at least two polarization directions and wherein the wire elements generally reflect most of the incident light of a first polarization direction and transmit most of the incident light of a second polarization direction.

10. A lithographic apparatus for providing an exposure beam along an optical path comprising:
    (a) a wire grid polarizer;
    (b) an illuminator having a pupil, wherein at least a portion of the pupil passes light polarized by the wire grid polarizer; and
    (c) a mask;
    wherein the wire grid polarizer comprises a substrate that is transparent to ultraviolet (UV) light and an array of concentric circular wire elements patterned on the substrate around an axis, leaving an unpatterned transmission aperture at a center of the substrate, the wire elements polarizing UV light incident on them, producing radially polarized output light.

11. The apparatus of claim 1, wherein materials for the wire elements include aluminum, silver, or gold.

12. The apparatus of claim 1, wherein the UV light incident on the wire elements is substantially unpolarized.

13. The apparatus of claim 1, wherein the wire elements in each of the truncated wedge-shaped groups have a varying pitch.

14. The apparatus of claim 1, wherein the wire elements in each of the truncated wedge-shaped groups have a constant pitch.

15. The apparatus of claim 10, wherein the concentric circular wire elements have a pitch between about $0.1\lambda$ and $2\lambda$, where $\lambda$ is the wavelength of the beam.

16. The apparatus of claim 10, wherein the concentric circular wire elements have a pitch between about 45 nm and 95 nm.

17. The apparatus of claim 10, wherein the concentric circular wire elements have a pitch approximately one-quarter of the wavelength of the beam.

18. The apparatus of claim 10, wherein the concentric circular wire elements have a varying pitch.

19. The apparatus of claim 10, wherein the concentric circular wire elements have a constant pitch.

20. The apparatus of claim 10, wherein a material of the substrate includes fused silica, calcium fluoride, sapphire, quartz, or magnesium fluoride.

21. The apparatus of claim 10, wherein materials for the wire elements include aluminum, silver, or gold.

22. The apparatus of claim 10, wherein the UV light incident on the wire elements comprises at least two polarization directions and wherein the wire elements generally reflect most of the incident light of a first polarization direction and transmit most of the incident light of a second polarization direction.

23. The apparatus of claim 10, wherein the UV light incident on the wire elements is substantially unpolarized.

* * * * *

UNITED STATES PATENT AND TRADEMARK OFFICE
CERTIFICATE OF CORRECTION

PATENT NO. : 7,304,719 B2 Page 1 of 1
APPLICATION NO. : 10/813168
DATED : December 4, 2007
INVENTOR(S) : Michael M. Albert It is certified that error appears in the above-identified patent and that said Letters Patent is hereby corrected as shown below:

On the Title Page, Item (56), References Cited, FOREIGN PATENT DOCUMENTS section, please replace "SU 2166819 C2 5/2001" with --RU 2166819 C2 5/2001--.

Signed and Sealed this

Third Day of June, 2008

JON W. DUDAS
*Director of the United States Patent and Trademark Office*